(12) United States Patent
Abbasfar

(10) Patent No.: US 11,764,805 B2
(45) Date of Patent: Sep. 19, 2023

(54) SYSTEM AND METHOD FOR TRANSITION ENCODING WITH REDUCED ERROR PROPAGATION

(71) Applicant: Samsung Display Co., Ltd., Yongin-si (KR)

(72) Inventor: Aliazam Abbasfar, Santa Clara, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 107 days.

(21) Appl. No.: 17/533,014

(22) Filed: Nov. 22, 2021

(65) Prior Publication Data

US 2023/0108230 A1 Apr. 6, 2023

Related U.S. Application Data

(60) Provisional application No. 63/252,948, filed on Oct. 6, 2021.

(51) Int. Cl.
| | |
|---|---|
| *H03M 7/46* | (2006.01) |
| *G06F 9/30* | (2018.01) |
| *H04L 7/00* | (2006.01) |
| *H03M 5/14* | (2006.01) |
| *H03M 13/31* | (2006.01) |

(52) U.S. Cl.
CPC .......... *H03M 7/46* (2013.01); *G06F 9/30029* (2013.01); *H03M 5/145* (2013.01); *H04L 7/0016* (2013.01); *H03M 13/31* (2013.01)

(58) Field of Classification Search
CPC ........ H03M 7/46; H03M 13/31; H03M 5/145; G06F 9/30029; H04L 7/0016

USPC .......................................................... 341/59
See application file for complete search history.

(56) References Cited

U.S. PATENT DOCUMENTS

| | | | |
|---|---|---|---|
| 5,671,236 | A | 9/1997 | Denissen et al. |
| 5,781,131 | A | 7/1998 | Shimpuku et al. |
| 5,854,810 | A | 12/1998 | Denissen et al. |
| 6,718,491 | B1 | 4/2004 | Walker et al. |

(Continued)

FOREIGN PATENT DOCUMENTS

| | | |
|---|---|---|
| CN | 110838892 A | 2/2020 |
| EP | 0658996 A1 | 6/1995 |
| EP | 2725716 A1 | 4/2014 |

OTHER PUBLICATIONS

Ahmed, Ali, et al., "A Secure Image Steganography using LSB and Double XOR Operations," IJCSNS Journal of Computer Science and Network Security, vol. 20, No. 5, May 2020, pp. 139-144.

(Continued)

*Primary Examiner* — Khai M Nguyen
(74) *Attorney, Agent, or Firm* — Lewis Roca Rothgerber Christie LLP

(57) ABSTRACT

A method of encoding input data includes receiving the input data that includes a plurality of input words including a first input word and a second input word, generating a plurality of converted words including a first converted word and a second converted word, the first converted word being based at least on the first input word, the second converted word being based on the first converted word and the second input word, identifying a key value based on the plurality of converted words, and generating a plurality of coded words based on the key value and the plurality of converted words.

20 Claims, 4 Drawing Sheets

(56) References Cited

U.S. PATENT DOCUMENTS

| | | |
|---|---|---|
| 6,914,637 B1 | 7/2005 | Wolf et al. |
| 6,986,094 B2 | 1/2006 | Grimsrud |
| 7,016,286 B2 | 3/2006 | Hayami et al. |
| 7,194,047 B2 | 3/2007 | Strolle et al. |
| 7,197,685 B2 | 3/2007 | Limberg |
| 7,680,269 B2 | 3/2010 | Nicolai et al. |
| 8,396,093 B2 | 3/2013 | Schilling et al. |
| 9,106,376 B2 | 8/2015 | Hwang et al. |
| 9,166,769 B2 | 10/2015 | Lee |
| 9,490,836 B2 * | 11/2016 | Mendel ................ H03M 5/145 |
| 9,729,681 B2 | 8/2017 | Lee |
| 9,942,063 B2 | 4/2018 | Mendel |
| 2004/0028076 A1 | 2/2004 | Strolle et al. |
| 2011/0083054 A1 | 4/2011 | Ozdemir et al. |

OTHER PUBLICATIONS

Misra, Jayadev, "The Wonderful Exclusive-Or: Error Detection and Correction," Jul. 2003, pp. 1-22, XP093017271, Retrieved from the Internet: URL: https://www.cs.utexas.edu/users/misra/Classes.dir/ClassNotes.dir/xor.pdf.

EPO Extended European Search Report dated Feb. 10, 2023, issued in corresponding European Patent Application No. 22199351.2 (13 pages).

Wu, T., et al., Stream Cipher by Reed-Solomon Code, IEEE, 2017, pp. 422-427.

* cited by examiner

SYSTEM AND METHOD FOR TRANSITION ENCODING WITH REDUCED ERROR PROPAGATION

CROSS-REFERENCE TO RELATED APPLICATION(S)

This application claims priority to, and the benefit of, U.S. Provisional Application No. 63/252,948 ("TRANSITION ENCODING METHOD WITH REDUCED ERROR PROPAGATION"), filed on Oct. 6, 2021, the entire content of which is incorporated herein by reference.

FIELD

Aspects of embodiments of the present disclosure are generally related to data communication systems.

BACKGROUND

Generally, serial data communication is commonly used in a variety of systems communicating over wires, over optical fibers, and even wirelessly. In serial communication of digital data, when a transmitter does not transmit the clock signal with the data stream, the receiver has to regenerate the clock using the timing information from the data stream. The process of extracting timing information from a serial data stream is known as clock recovery and is crucial for allowing the receiver circuit to decode the transmitted symbols.

Clock recovery at the receiver can be assisted by modifying the transmitted data to ensure that there are a sufficient number of transitions within a data stream. In other words, the worst-case no-transition run-length has to be limited. To ensure frequent transitions, a transmitter may utilize a transition encoding algorithm to encode the raw data such that transitions happen regularly.

The above information disclosed in this Background section is only for enhancement of understanding of the present disclosure, and therefore it may contain information that does not form the prior art that is already known to a person of ordinary skill in the art.

SUMMARY

Aspects of embodiments of the present disclosure are directed to a system and method for encoding a transmission stream to enable clock recovery at the receiver that exhibits lower error propagation. In some embodiments, the transmitter encodes the data stream by preprocessing the data stream before coding the data stream using a key value. In some embodiments, the receiver decodes the coded stream by applying binary XOR operations on consecutive coded words of the received coded stream.

According to some embodiments of the present invention, there is provided a method of encoding input data, the method including: receiving the input data that includes a plurality of input words including a first input word and a second input word; generating a plurality of converted words including a first converted word and a second converted word, the first converted word being based at least on the first input word, the second converted word being based on the first converted word and the second input word; identifying a key value based on the plurality of converted words; and generating a plurality of coded words based on the key value and the plurality of converted words.

In some embodiments, the first input word is an (i−1)th input word, the second input word is an ith input word, i being an integer greater than 1, and the first converted word is an (i−1)th converted word and the second converted word is an ith converted word.

In some embodiments, the generating the plurality of converted words includes: generating the first converted word as the first input word; and generating the second converted word by performing a binary XOR operation on the second input word and the first converted word.

In some embodiments, the generating the plurality of converted words includes: generating the first converted word by performing a binary XOR operation on the first input word and a previous converted word of the plurality of converted words; and generating the second converted word by performing a binary XOR operation on the second input word and the first converted word.

In some embodiments, a bit length of the first input word is a same as that of the first converted word.

In some embodiments, a bit length of the first converted word is a same as that of a coded word of the plurality of coded words.

In some embodiments, the key value has a same bit length as one of the plurality of converted words, and is not the same as any one of the plurality of converted words.

In some embodiments, the plurality of coded words includes a first coded word and a second coded word, the first coded word being based at least on the key value and the second coded word being based on the key value and the first converted word.

In some embodiments, the generating the plurality of coded words includes: generating the first coded word as the key value; and generating the second converted word by performing a binary XOR operation on the first input word and the key value.

In some embodiments, the generating the plurality of coded words includes: generating the first coded word by performing a binary XOR operation on the first converted word and the key value; and generating the second coded word by performing a binary XOR operation on the second converted word and the key value.

In some embodiments, the plurality of converted words denoted as $\{y_1, y_2, \ldots, y_N\}$ is expressed as: $\{x_1, x_2\hat{~}x_1, \ldots, x_N\hat{~} \ldots \hat{~}x_2\hat{~}x_1\}$, where $\{x_1, x_2, \ldots, x_N\}$ represent the plurality of input words, N is an integer greater than 2, and $\hat{~}$ symbolizes a binary XOR operation.

In some embodiments, the plurality of coded words is expressed as: $\{D, y_1\hat{~}D, y_2\hat{~}D, \ldots, y_N\hat{~}D\}$, where D represents the key value.

In some embodiments, the method further includes: transmitting transmission data to a receiver through a communication channel, the transmission data including the plurality of coded words.

According to some embodiments of the present invention, there is provided a transition encoder for encoding input data, the transition encoder including: a processor; and a processor memory local to the processor, wherein the processor memory has stored thereon instructions that, when executed by the processor, cause the processor to perform: receiving the input data that includes a plurality of input words including a first input word and a second input word; generating a plurality of converted words including a first converted word and a second converted word, the first converted word being based at least on the first input word, the second converted word being based on the first converted word and the second input word; identifying a key value based on the plurality of converted words; and generating a plurality of coded words based on the key value and the plurality of converted words.

According to some embodiments of the present invention, there is provided a method of decoding transmission data, the method including: receiving the transmission data that includes a plurality of coded words including a first coded word and a second coded word; and generating a first decoded word of a plurality of decoded words by performing a binary XOR operation on the first and second coded words.

In some embodiments, the first and second coded words are consecutive words.

In some embodiments, the plurality of coded words is expressed as: $\{D, y_1\hat{\ }D, y_2\hat{\ }D, \ldots, y_N\hat{\ }D\}$, where $\{y_1, y_2, \ldots, y_N\}$ represent a plurality of converted words, D represents a key value used to code the plurality of coded words, and $\hat{\ }$ symbolizes the binary XOR operation.

In some embodiments, the plurality of converted words is expressed as: $\{x_1, x_2\hat{\ }x_1, \ldots, x_N\hat{\ }\ldots\hat{\ }x_2\hat{\ }x_1\}$, where $\{x_1, x_2, \ldots, x_N\}$ represent the plurality of decoded words, and N is an integer greater than 2.

In some embodiments, a bit length of the first coded word is a same as that of the first decoded word.

In some embodiments, receiving the transmission data includes: receiving the transmission data from a transmitter through a communication channel.

BRIEF DESCRIPTION OF THE DRAWINGS

The accompanying drawings, together with the specification, illustrate example embodiments of the present disclosure, and, together with the description, serve to explain the principles of the present disclosure.

DETAILED DESCRIPTION

The detailed description set forth below is intended as a description of example embodiments of a system and method for transition encoding/decoding data in serial data communication, provided in accordance with the present disclosure, and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

In the related art, to achieve run-length-limited transmission, a transmitter may convert input data to coded words for transmission by identifying a key based on the input data, encoding each word of the input data using the key, and transmitting the key along with the coded words to a receiver. The coded data may have a desired run-length limit. The receiver in turn identifies the key in the transmission data and uses it to decode the received coded words to obtain the original input data. However, if there is an error in the identified key (e.g., due to a lossy/noisy communication channel), every single word coded with the key may be decoded incorrectly. As a result, an error in the identified key many propagate down to the decoded words and corrupt many words of the received data. This may necessitate retransmission of data and reduce the overall transmission rate of the transmitter-receiver system.

To alleviate this error propagation, according to some embodiments, the transmitter includes a transition encoder that preprocesses the words of the input data by a running XOR operation or an accumulative XOR operation and applies a key value to the preprocessed words to generate coded words. The coded words are transmitted to the receiver, which decodes the received coded words by serially performing XOR operations on two consecutive coded words at a time to obtain the original input words. Using such a method, an error in the key value or any other received coded word, may at most corrupt two words. Therefore, unlike the related art, the error does not propagate down the chain of coded words.

Figure 1A:
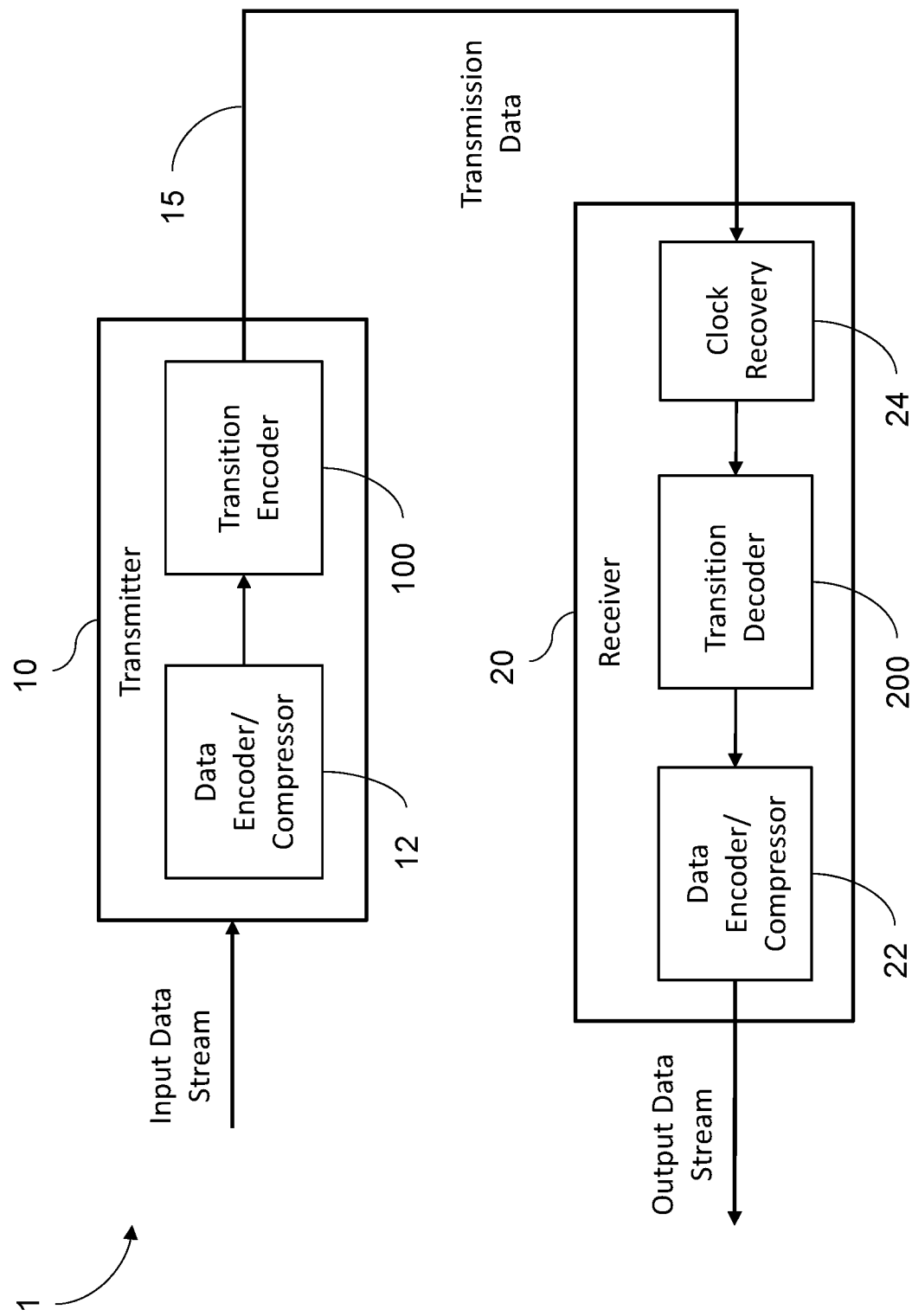
FIG. 1A is a block diagram of a serial data communication system, according to some embodiments of the present disclosure.
Figure 1B:
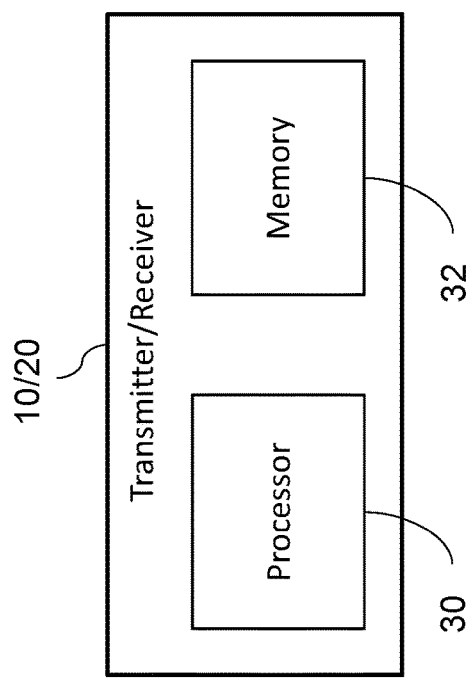
FIG. 1B illustrates a block diagram of a transmitter/receiver of the serial data communication system, according to some embodiments of the present disclosure.

FIG. 1A is a block diagram of a serial data communication system 1, according to some embodiments of the present disclosure. FIG. 1B illustrates a block diagram of a transmitter/receiver of the serial data communication system 1, according to some embodiments of the present disclosure.

Referring to FIG. 1A, in some embodiments, the serial data communication system 1 includes a transmitter 10, a communication channel (e.g., serial communication channel) 15, and a receiver 20. The transmitter 10 may include a data compressor and/or encoder 12 for performing compression and/or encoding on an input data stream to generate transmission data for transmission through the communication channel 15 to the receiver 20. The receiver 20 may include a data decompressor and/or decoder 22 for performing decompression and/or decoding on the data stream received by the receiver 20 to recover the input data stream.

According to some embodiments, the transmitter 10 includes a transition encoder 100 configured to encode the transmission data stream by ensuring that transitions occur with at least a particular frequency that enables the receiver 20 to extract the clock signal from the coded data stream (e.g., transition-encoded) transmitted over the communication channel 15. That is, the transition encoder 100 limits the run-length of the coded data stream.

As shown in FIG. 1B, the operations performed by the constituent components of the transmitter 10 and the receiver 20 may be performed by a "processing circuit" or "processor" 30 that may include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example, a processing circuit may include two processing circuits, an FPGA and a CPU, interconnected on a PWB. A processor memory 32 that is local to the processor 30 may have stored thereon instructions that, when executed by the processor 30, cause the processor 30 to perform the operations described herein with respect to FIGS. 1A and 2-4.

Figure 2:
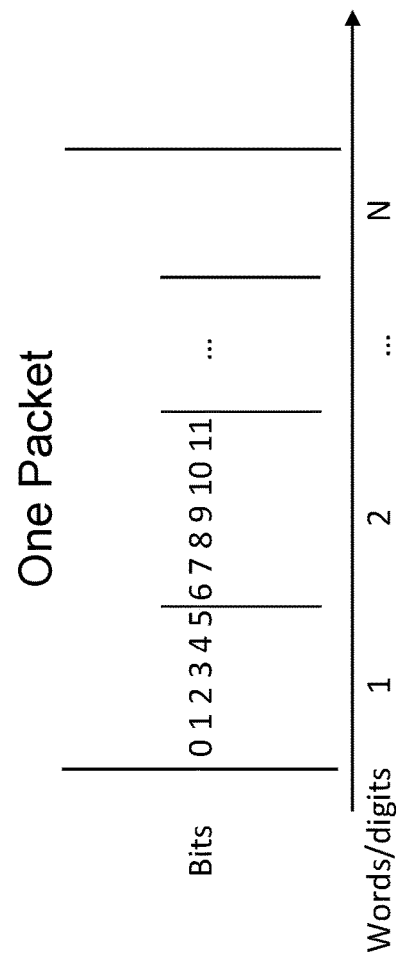
FIG. 2 illustrates a packet of data that is partitioned into a number of words, according to some embodiments of the present disclosure.

FIG. 2 illustrates a packet of data that is partitioned into a number of words, according to some embodiments of the present disclosure.

Referring to FIGS. 1A and 2, in some embodiments, the transition encoder 100 divides the input data (that may or may not have been encoded/compressed by the data compressor and/or encoder 12) into a number of input data packets (e.g., bit streams). Each input data packet (also referred to as an input packet) is partitioned into N words/digits, where each word/digit contains q bits. Thus, the data packet X may be represented as:

$$X[0:q \times N-1] = x_1(b[0:q-1]), x_2(b[q:2q-1]), \ldots, x_N(b[q \times (N-1):(q \times N)-1]) \quad \text{Eq (1)}$$

where $x_1, x_2, \ldots, x_N$ represent the N words/digits making up the input packet, and each has a value between 0 to $2^{q-1}$. In the example of FIG. 2, each word includes 6 bits (i.e., q=6) and has a value in the [0:63] range. However, embodiments of the present invention are not limited thereto, and each word may include any suitable number of bits (e.g., 8 bits).

The transition encoder 100 encodes/scrambles each word to ensure transitions in every word/digit and to limit the run-length of the transmitted data to a desired value.

According to some embodiments, the transition encoder 100 preprocesses the input data packet to generate a converted packet Y that includes a plurality of converted words $y_0, y_1, \ldots, y_N$, each of which also has a value between 0 to $2^{q-1}$. Each converted word y may be based on one or more of the input words x. In some embodiments, the transition encoder 100 utilizes a running XOR operation or an accumulated XOR operation on the input words to generate the converted words. The converted word $y_i$ (i being an integer greater than 1) may be expressed as:

$$y_i = x_i \,\hat{}\, y_{i-1} \quad \text{Eq (2)}$$

where the symbol ^ symbolizes the binary XOR operation, and where $y_1 = x_1$. Thus, the converted packet (also referred to as an XOR accumulated packet) may be expressed as:

$$Y = \{y_1, y_2, \ldots, y_N\} = \{x_1, x_2\,\hat{}\,x_1, x_3\,\hat{}\,x_2\,\hat{}\,x_1, \ldots, x_N\,\hat{}\,\ldots\,\hat{}\,x_2\,\hat{}\,x_1\} \quad \text{Eq (3)}$$

The transition encoder 100 then determines a key value D based on the plurality of converted words by identifying a value that is different from each of the converted words. For example, the transition encoder 100 may run through all possible binary values of a word having a same bit length as the converted word, compare each binary value with each of the converted words, and select the first binary value that is different from each of the converted words as the key value. However, embodiments of the present disclosure are not limited thereto, and any suitable method may be used to determine the key value. Here, the key value has the same number of bits (i.e., bit length) as a converted word and an input word.

The transition encoder 100 generates a coded packet that includes a plurality of coded words for transmission to the receiver 20. The coded packet is based on the key value and the converted packet. In some embodiments, each coded word is the result of performing an XOR operation on a corresponding converted word and the key value. As such, the coded packet Z may be expressed as:

$$Z = \{z_1, z_2, \ldots, z_N\} = \{D, y_1\,\hat{}\,D, y_2\,\hat{}\,D, \ldots, y_N\,\hat{}\,D\} \quad \text{Eq (4)}$$

where D represents the key value. As the coded packet includes the key value as well as the coded words, the word length of the coded packet is one greater than the converted packet (i.e., it includes N+1 words). While Equation 4 expresses the key value as the first word of the coded packet, embodiments of the present disclosure are not limited thereto. For example, the key value may be the last word in the coded packet Z, or may have any other suitable position within the packet as long as the receiver 20 is aware of the position of the key value within the packet and the decoding is performed accordingly.

According to some embodiments, once the transmission data is received by the receiver 20 via the communication channel 15, the transition decoder 200 decodes each of the received coded word based on a corresponding pair of the coded words and generates a decoded packet X', which is expressed as $\{x'_1, x'_2, \ldots, x'_{N+1}\}$. In some embodiments, the decoded word $x'_i$ (i being an integer greater than or equal to 1) may be expressed as:

$$x'_i = z_i \,\hat{}\, z_{i+1} \quad \text{Eq (5)}$$

Thus, using the commutative, associative, and self-inverse properties of the XOR operation, $$x'_1 = z_1 \,\hat{}\, z_2 = D \,\hat{}\, (y_1 \,\hat{}\, D) = y_1 = x_1 \quad \text{Eq(6)}$$

$$x'_2 = z_2 \,\hat{}\, z_3 = (y_1 \,\hat{}\, D) \,\hat{}\, (y_2 \,\hat{}\, D) = y_1 \,\hat{}\, y_2 = x_1 \,\hat{}\, (x_2 \,\hat{}\, x_1) = x_2 \quad \text{Eq(7)}$$

...

$$x'_N = z_N \,\hat{}\, z_{N+1} = (y_{N-1} \,\hat{}\, D) \,\hat{}\, (y_N \,\hat{}\, D) = \quad \text{Eq(8)}$$
$$y_{N-1} \,\hat{}\, y_N = (x_{N-1} \,\hat{}\, \ldots \,\hat{}\, x_2 \,\hat{}\, x_1) \,\hat{}\, (x_N \,\hat{}\, x_{N-1} \,\hat{}\, \ldots \,\hat{}\, x_2 \,\hat{}\, x_1) = x_N$$

Therefore, assuming the received coded packet is not corrupted by any errors, the receiver 20 (e.g., the transitional decoder 200) can recover the original input packet by performing an XOR operation on consecutive words of the received coded packet. If, however, any of the received words at the receiver 20 is corrupted by an error, the error affects at most two of the decoded words, and does not propagate down the chain to affect the other decoded words. For example, if the first coded value $z_1$, i.e., the key value D, is not received correctly due an error, only the first decoded word $x'_1$ may be affected, and this error does not affect the calculation of the remaining decoded words. Similarly, if second coded value $z_2$ is corrupted, the calculation of the second and third decoded words $x'_2$ and $x'_3$, which involve the second coded value $z_2$ may also be corrupted; however, as the calculation of the remaining decoded words does not depend on the second coded value $z_2$, they may not be affected by this error.

Therefore, by preprocessing the input words as expressed in Equation 3 and by reducing the decoding operation to two consecutive received words, the serial data communication system 1 is capable of isolating error propagation of any single error to the corresponding two consecutive coded words. This is in contrast to the related art in which the corruption of the key value during transmission may result in the corruption of the entire received packet. Moreover, the communication system 1, according to some embodiments, achieves this desirable effect without adding any overhead to the transition encoding scheme.

Figure 3:
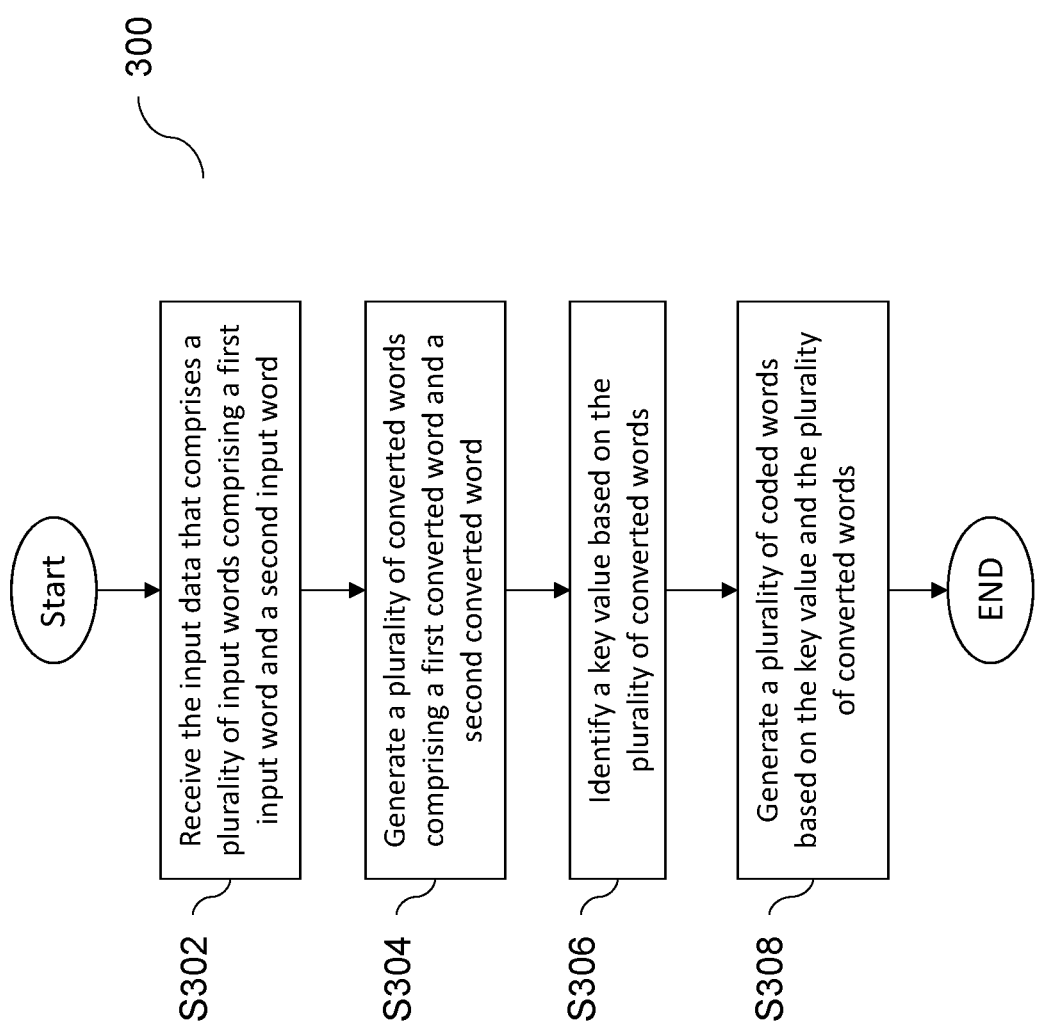
FIG. 3 illustrates a process of encoding input data, according to some embodiments of the present disclosure.

FIG. 3 illustrates a process 300 of encoding input data, according to some embodiments of the present disclosure.

In some embodiments, the transmitter 10 (e.g., the transition encoder 100) receives the input data that includes a plurality of input words (e.g., $x_1, x_2, \ldots, x_N$), which includes a first input word and a second input word (S302). In some examples, the first input word may be an (i−1)th input word $x_{i-1}$ and the second input word may be an ith input word $x_i$ (i being an integer greater than 1).

The transmitter 10 then generates a plurality of converted words including a first converted word and a second converted word (S304). The first converted word may be an (i−1)th converted word $y_{i-1}$ and the second converted word may be an ith converted word $y_i$. The first converted word may be based at least on the first input word and the second converted word may be based on the first converted word and the second input word. In some examples, generating the plurality of converted words includes: generating the first converted word as the first input word, and generating the second converted word by performing a binary XOR operation on the second input word and the first converted word. In some examples, generating the plurality of converted words includes: generating the first converted word by performing a binary XOR operation on the first input word and the previous converted word of the plurality of converted words, and generating the second converted word by performing a binary XOR operation on the second input word and the first converted word. Here, the bit length of the first/second input word is the same as that of the first/second converted word and that of the first/second coded word.

In some embodiments, the transmitter 10 identifies a key value D based on the plurality of converted words (S306), and generates a plurality of coded words (e.g., $z_1, z_2, \ldots, z_N$) based on the key value and the plurality of converted words (S308). In some examples, the key value may have the same bit length as one of the plurality of converted words, and does not match the binary value (or the binary complement) of any of the plurality of converted words. The plurality of coded words may include a first coded word based at least on the key value and a second coded word being based on the key value and the first converted word. In some examples, generating the plurality of coded words may include generating the first coded word as the key value, and generating the second converted word by performing a binary XOR operation on the first input word and the key value. In other examples, generating the plurality of coded words may include generating the first coded word by performing a binary XOR operation on the first converted word and the key value; and generating the second coded word by performing a binary XOR operation on the second converted word and the key value.

Figure 4:
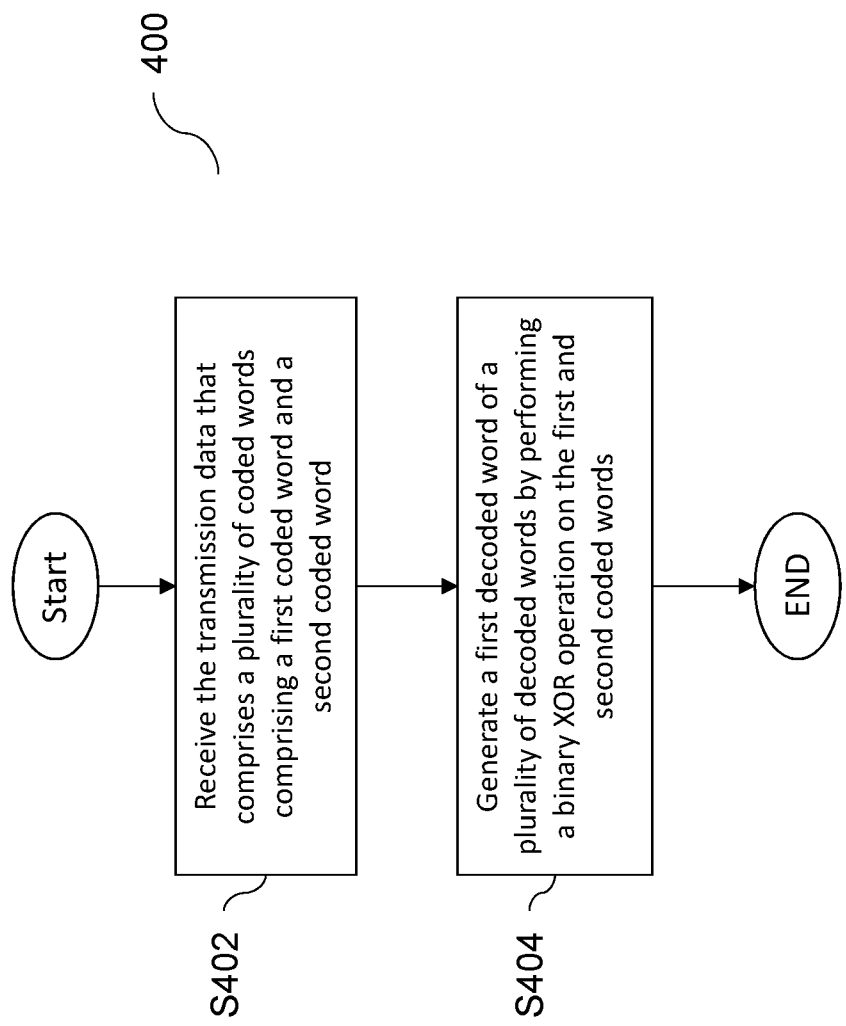
FIG. 4 illustrates a process of decoding transmission data, according to some embodiments of the present disclosure.

FIG. 4 illustrates a process 400 of decoding transmission data, according to some embodiments of the present disclosure.

In some embodiments, the receiver 20 receives the transmission data, which includes a plurality of coded words (S402), from the transmitter 10 through the communication channel 15. The coded words include a first coded word and a second coded word. The receiver 20 (e.g., transition decoder 200) generates a plurality of decoded words (S404). The receiver 20 generates a first decoded word of the plurality of decoded words by performing a binary XOR operation on the first and second coded words. In some embodiments, the first and second coded words are consecutive words. The bit length of the first coded word may be the same as that of the first decoded word.

As described above, the transition encoding of the XOR accumulated packet, according to some embodiments, enables the differential detection of the coded words at the receiver. The transition encoding method preprocesses a packet of input words by performing an accumulative XOR operations on the input words, and then utilizes an XOR-based transition encoding technique with a transition key to ensure transition in the transmitted data stream. The transition decoding scheme of the receiver 20 is based on the XOR of two consecutive data for detection.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept". Also, the term "exemplary" is intended to refer to an example or illustration.

As used herein, the terms "use", "using", and "used" may be considered synonymous with the terms "utilize", "utilizing", and "utilized", respectively.

Further, the use of "may" when describing embodiments of the inventive concept refers to "one or more embodiments of the inventive concept." Also, the term "exemplary" is intended to refer to an example or illustration.

While this disclosure has been described in detail with particular references to illustrative embodiments thereof, the embodiments described herein are not intended to be exhaustive or to limit the scope of the disclosure to the exact forms disclosed. Persons skilled in the art and technology to which this disclosure pertains will appreciate that alterations and changes in the described structures and methods of assembly and operation can be practiced without meaningfully departing from the principles, and scope of this disclosure, as set forth in the following claims and equivalents thereof.

What is claimed is:

1. A method of encoding input data, the method comprising:
   receiving the input data that comprises a plurality of input words comprising a first input word and a second input word;
   generating a plurality of converted words comprising a first converted word and a second converted word, the first converted word being based at least on the first input word, the second converted word being based on the first converted word and the second input word;
   identifying a key value based on the plurality of converted words; and
   generating a plurality of coded words based on the key value and the plurality of converted words.

2. The method of claim 1, wherein the first input word is an (i−1)th input word, the second input word is an ith input word, i being an integer greater than 1, and
   wherein the first converted word is an (i−1)th converted word and the second converted word is an ith converted word.

3. The method of claim 1, wherein the generating the plurality of converted words comprises:
   generating the first converted word as the first input word; and
   generating the second converted word by performing a binary XOR operation on the second input word and the first converted word.

4. The method of claim 1, wherein the generating the plurality of converted words comprises:
   generating the first converted word by performing a binary XOR operation on the first input word and a previous converted word of the plurality of converted words; and
   generating the second converted word by performing a binary XOR operation on the second input word and the first converted word.

5. The method of claim 1, wherein a bit length of the first input word is a same as that of the first converted word.

6. The method of claim 1, wherein a bit length of the first converted word is a same as that of a coded word of the plurality of coded words.

7. The method of claim 1, wherein the key value has a same bit length as one of the plurality of converted words, and is not the same as any one of the plurality of converted words.

8. The method of claim 1, wherein the plurality of coded words comprises a first coded word and a second coded word, the first coded word being based at least on the key value and the second coded word being based on the key value and the first converted word.

9. The method of claim 8, wherein the generating the plurality of coded words comprises:
   generating the first coded word as the key value; and
   generating the second converted word by performing a binary XOR operation on the first input word and the key value.

10. The method of claim 8, wherein the generating the plurality of coded words comprises:
   generating the first coded word by performing a binary XOR operation on the first converted word and the key value; and
   generating the second coded word by performing a binary XOR operation on the second converted word and the key value.

11. The method of claim 1, wherein the plurality of converted words denoted as $\{y_1, y_2, \ldots, y_N\}$ is expressed as:

$$\{x_1, x_2 \hat{\ } x_1, \ldots, x_N \hat{\ } \ldots \hat{\ } x_2 \hat{\ } x_1\},$$

where $\{x_1, x_2, \ldots, x_N\}$ represent the plurality of input words, N is an integer greater than 2, and $\hat{\ }$ symbolizes a binary XOR operation.

12. The method of claim 11, wherein the plurality of coded words is expressed as:

$$\{D, y_1 \hat{\ } D, y_2 \hat{\ } D, \ldots, y_N \hat{\ } D\},$$

where D represents the key value.

13. The method of claim 1, further comprising:
   transmitting transmission data to a receiver through a communication channel, the transmission data comprising the plurality of coded words.

14. A transition encoder for encoding input data, the transition encoder comprising:
   a processor; and
   a processor memory local to the processor, wherein the processor memory has stored thereon instructions that, when executed by the processor, cause the processor to perform:
      receiving the input data that comprises a plurality of input words comprising a first input word and a second input word;
      generating a plurality of converted words comprising a first converted word and a second converted word, the first converted word being based at least on the first input word, the second converted word being based on the first converted word and the second input word;
      identifying a key value based on the plurality of converted words; and
      generating a plurality of coded words based on the key value and the plurality of converted words.

15. A method of decoding transmission data, the method comprising:
   receiving the transmission data that comprises a plurality of coded words comprising a first coded word and a second coded word; and
   generating a first decoded word of a plurality of decoded words by performing a binary XOR operation on the first and second coded words.

16. The method of claim 15, wherein the first and second coded words are consecutive words.

17. The method of claim 15, wherein the plurality of coded words is expressed as:

$$\{D, y_1 \hat{\ } D, y_2 \hat{\ } D, \ldots, y_N \hat{\ } D\},$$

where $\{y_1, y_2, \ldots, y_N\}$ represent a plurality of converted words, D represents a key value used to code the plurality of coded words, and $\hat{\ }$ symbolizes the binary XOR operation.

18. The method of claim 17, wherein the plurality of converted words is expressed as:

$$\{x_1, x_2 \hat{\ } x_1, \ldots, x_N \hat{\ } \ldots \hat{\ } x_2 \hat{\ } x_1\},$$

where $\{x_1, x_2, \ldots, x_N\}$ represent the plurality of decoded words, and N is an integer greater than 2.

19. The method of claim 15, wherein a bit length of the first coded word is a same as that of the first decoded word.

20. The method of claim 15, wherein receiving the transmission data comprises:
   receiving the transmission data from a transmitter through a communication channel.

* * * * *